United States Patent [19]

Bakken

[11] 4,024,471

[45] May 17, 1977

[54] METER AND AMPLIFIER CIRCUIT FOR MEASURING AC AND DC SIGNALS

[76] Inventor: Ronald J. Bakken, 3918 - 31st Ave. South, Minneapolis, Minn. 55406

[22] Filed: Sept. 8, 1975

[21] Appl. No.: 611,061

[52] U.S. Cl. .......................... 324/123 R; 324/119; 330/13
[51] Int. Cl.² .................... G01R 1/30; G01R 19/22
[58] Field of Search .......... 324/123 R, 119; 330/13

[56] References Cited
UNITED STATES PATENTS

| | | | |
|---|---|---|---|
| 2,955,257 | 10/1960 | Lindsay | 330/13 |
| 3,319,175 | 5/1967 | Dryden | 330/13 |

OTHER PUBLICATIONS

Sensitive DC–VTVM Type MV–27C; Millivac Inst. Corp., Schenectady, N.Y., Nov. 8, 1956.

Primary Examiner—Rudolph V. Rolinec
Assistant Examiner—Ernest F. Karlsen
Attorney, Agent, or Firm—Stuart R. Peterson

[57] ABSTRACT

The bases of a first pair of opposite conductivity transistors are connected to one input terminal of the amplifier circuit. A conventional meter is connected in the collector-emitter path of a second pair of transistors. Four arrangements are disclosed for coupling the first pair of transistors to the second pair; two of the embodiments enable DC signals to be measured and the other two AC signals.

7 Claims, 4 Drawing Figures

METER AND AMPLIFIER CIRCUIT FOR MEASURING AC AND DC SIGNALS

BACKGROUND OF THE INVENTION

1. Field of the Invention

This invention relates generally to a meter and amplifier circuit for measuring both current and voltage, and pertains more particularly to a circuit involving two pairs of opposite conductivity transistors having a special circuit configuration associated therewith so that conventional electromechanical indicating devices can be effectively utilized.

2. Description of the Prior Art

Various transistor amplifier circuits have been devised for use in conjunction with electromechanical meters. However, most of the circuits with which I am familiar are quite costly and complicated, frequently requiring careful transistor matching and precision resistors. Also, as far as cost is concerned, battery life has at times been sacrificed in order to make the overall circuit less expensive. Usually, there is an objectionable amount of current drain from the circuit being measured. Even line voltage interference, where step-down transformers and rectifiers are used instead of batteries to supply the low DC source of power, has proved objectionable heretofore in some types of instruments.

Consequently, while some prior art arrangements have certain acceptable attributes, they have the decided disadvantage of possessing one or more shortcomings. Therefore, a generally satisfactory amplifier and meter combination has not yet been devised as far as I am aware.

SUMMARY OF THE INVENTION

Accordingly, one important object of my invention is to provide a combined meter and amplifier circuit that will be inexpensive to manufacture and which will utilize a conventional meter that can also be relatively low in cost.

Another object of the invention is to provide a circuit and meter combination which can be simply and easily constructed.

An additional object is to provide a high current amplification without the sophisticated circuitry heretofore resorted to.

Still further, an object is to provide instrumentation circuitry of the foregoing character that will involve very little current drain from the signal source being measured.

Also, the invention has for an object the provision of a very compact circuit that can be, if desired, inserted into the casings of many older instruments, particularly the larger volt-ohmeters (VOM's) and also laboratory models.

Still another object is to provide circuitry for use in conjunction with conventional meters that involves transistors that do not have to be precisely matched, and in which precision resistors are not required, although even greater measuring accuracy results, where care is exercised in the selection of these components. In other words, if a laboratory quality instrument is desired, the extra time and effort may be justified.

Another object is to provide a meter and amplifier circuit that will result in a relatively long battery life.

Yet another object is to provide circuitry of the foregoing character that can be readily adapted for measuring either DC or AC signals.

Briefly, my invention comprises a circuit utilizing two pairs of opposite conductivity transistors which are connected so that a conventional electromechanical indicating device is contained in the collector-emitter paths of the second pair. The bases of the first pair of transistors are tied together and connected directly to one of the input terminals. Provision is made for measuring either DC or AC signals at the input terminals, deriving a DC output closely proportional to the input valve.

DESCRIPTION OF THE PREFERRED EMBODIMENTS

Figure 1:
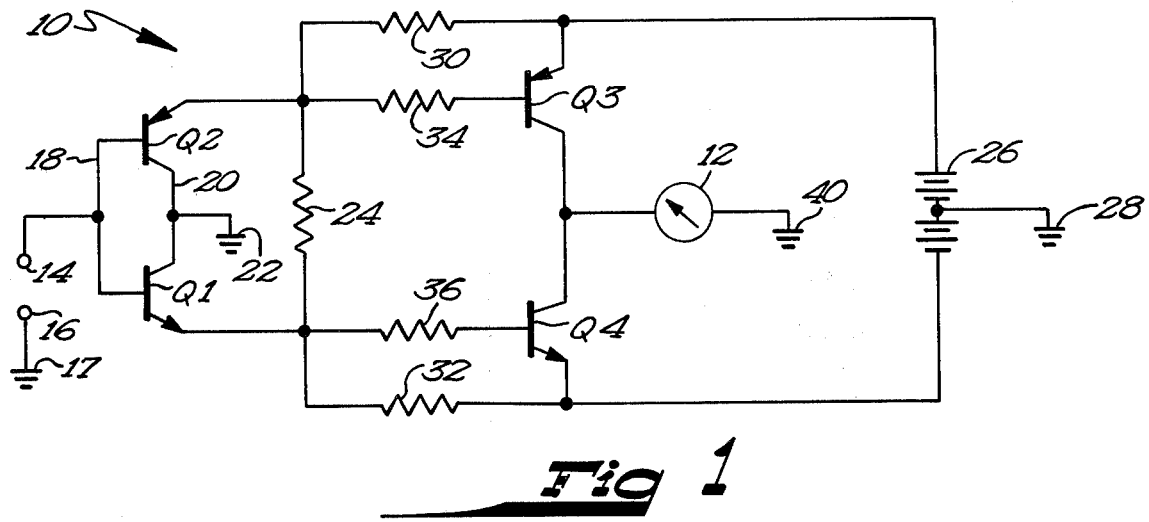
FIG. 1 is a schematic diagram showing a meter and amplifier circuit associated therewith exemplifying my invention when used to measure the magnitude of a DC signal.

One form of measuring the circuit exemplifying my invention has been designated in its entirety by the reference numeral 10 in FIG. 1. Included is a conventional direct current D'Arsonval type microamp meter, such as a meter having a rating of 100 millivolts, 1K ohms and 100 ua.

The circuitry 10 comprises a pair of input terminals 14 and 16, the latter being grounded at 17. As can be seen from the drawing, there are four transistors Q1, Q2, Q3 and Q4. The transistors Q1 and Q2 are of opposite conductivity types, more specifically NPN and PNP types, respectively, whereas the transistors Q3 and Q4 are also of opposite conductivity types, more specifically, PNP and NPN types, respectively. The transistors Q1 and Q2 operate in a push-pull fashion and constitute the first amplifying stage of the overall circuit 10, whereas the transistors Q3 and Q4 function as a push-pull second amplifier stage.

The bases of amplifiers Q1 and Q2 are tied together by reason of a conductor 18, the conductor 18 being attached directly to the input terminal 14. The collectors of the transistors Q1 and Q2 are also tied together by a conductor 20, the conductor 20 being grounded at 22. The emitters of the transistors Q1 and Q2 are electrically connected through an emitter bias resistor 24.

A power supply 26 in the form of a center tapped battery grounded at 28 has its positive side connected to the emitter of the transistor Q2 through a resistor 30. The emitter of the transistor Q1 is connected to the negative side of the battery 26 through a resistor 32.

It will be observed that the battery 26 also supplies the biasing potentials for the transistors Q3, Q4 in that the positive side thereof is connected to the base of the transistor Q3 through a coupling resistor 34 and the negative side thereof to the base of the transistor Q4 through a similar resistor 36. The emitters of the transistors Q3, Q4 are directly connected to the positive and negative sides, respectively, of the power supply 26. Still further, the collectors of the transistor Q3, Q4 are tied together by a conductor 38 which is in turn connected to one side of the meter 12, the other side of the meter 12 being grounded at 40 to completed the biasing of the second pair of transistor Q3, Q4.

In understanding the operation of the circuit 10, it will be helpful to note that the transistors Q1, Q4 function as a Darlington pair, the base current of transistor Q1 being part of the emitter current of the transistor Q1 and which base current must flow through the base-emitter path of the transistor Q4. The transistors Q2, Q3 constitute a second Darlington pair. Stated somewhat differently, the transistors Q1, Q2, Q3 and Q4 collectively act as what might be called a dual Darlington configuration.

The circuit 10 of FIG. 1 is to be used for measuring current. With the terminals 14, 16 connected to the signal source (not shown) so that they are positive and negative, respectively, it follows that a positive potential will be applied to the bases of the transistors Q1 and Q2 via the conductor 18. Being of NPN conductivity, this results in the transistor Q1 becoming conductive, or at least more so. Owing to the opposite conductivity of the transistor Q2, the positive signal applied to the base of the transistor Q2 will turn this transistor off or at least increase its impedance. It is not necessary that the transistor Q1 be turned completely on or the transistor Q2 completely off. This will depend upon the magnitude of signal current.

Whereas the joined ends of the resistors 24, 32 and 36 are negative when the transistor Q1 is not conducting and relatively negative when conducting slightly by reason of the other end of the resistor 32 being connected to the negative terminal of the battery 26, when the transistor Q1 is turned on or conducts more heavily, then the junction 24, 32, 36 becomes more positive because of the voltage drop produced by the increased current flow through the resistor 32. As the currents shift, transistor Q4 is biased more in its forward direction, doing so in accordance with the increase in bias. At the same time, transistor Q3 becomes less biased in a forward direction.

Should the polarity of the DC signal applied to the input terminals 14, 16 be reversed, that is terminal 14 be negative, the conductivity described above with respect to the transistors Q1, Q4 occurs for transistors Q2, Q3 since these transistors are of the PNP type.

In either event, the turning on of Q4 or Q3 provides a low impedance path through the meter 12, doing so via the collector-emitter of either transistor Q4 or Q3, as the case may be. In this regard, if transistor Q4 is rendered conductive, the grounds 28 and 40 being positive with respect to the negative side of the battery 26, causes current to flow through the meter 12 and the collector-emitter path of transistor Q4. On the other hand, if transistor Q3 becomes conductive, current flows through the emitter-collector path of the transistor Q3, the meter 12 and the grounds 28, 40.

Turning now to FIG. 2, the meter is again identified by the reference numeral 12. Owing to the fact that the amplifier circuit 10 has been modified in this instance it has been assigned the reference numeral 110. It includes the input terminals 14, 16, of the transistors Q1, Q2, Q3, Q4 and battery 26.

While the bases of the transistors Q1 and Q2 are tied to each other and to the terminal 14, these collectors are not; instead the collector for the transistor Q1 is connected directly to the base of the transistor Q3, whereas the collector for the transistor Q2 is similarly connected to the base of the transistor Q4.

Instead of the signal emitter resistor 24 in the FIG. 1 circuitry, the present circuit 110 utilizes two emitter bias resistors 124a, 124b, the junction of these two resistors being grounded at 122. Performing a bias and coupling function in the circuit 110 are resistors 134 and 136.

Figure 2:
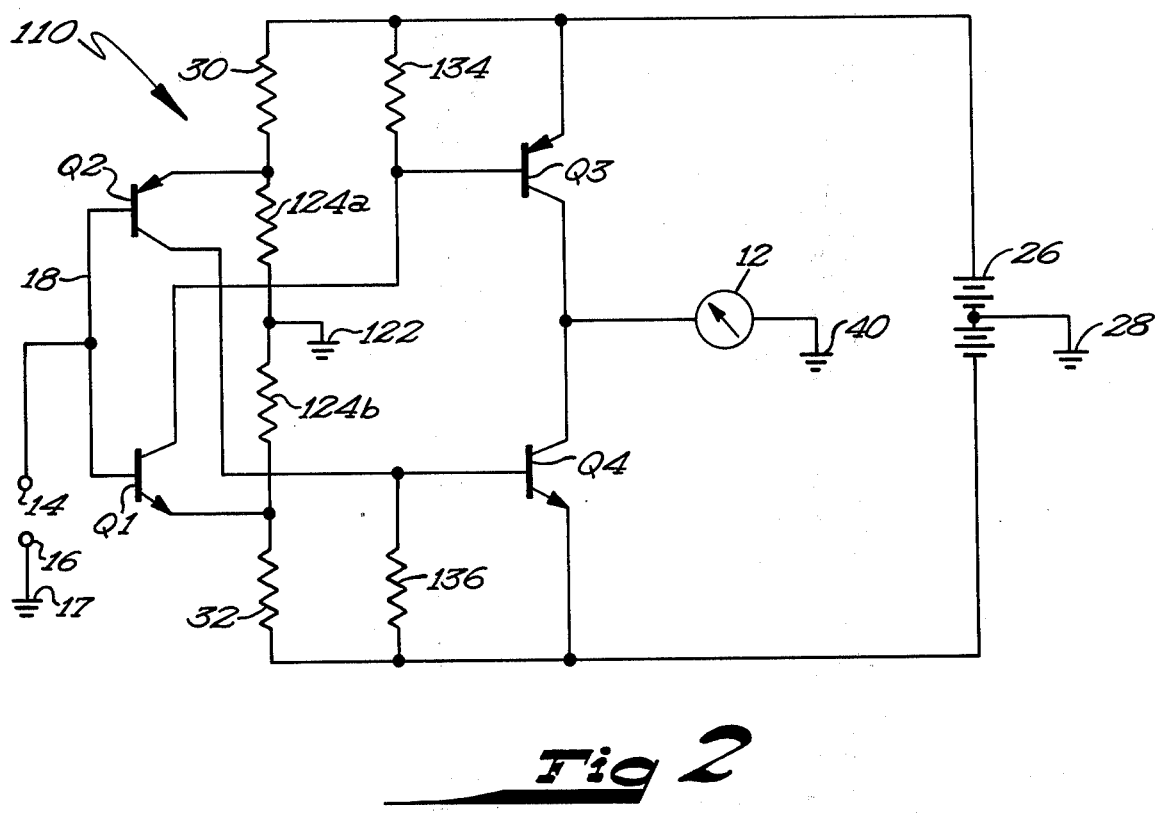
FIG. 2 is a schematic diagram illustrating another form my invention may constitute in measuring values of DC signals.

In the circuit 110 of FIG. 2, when the transistor Q1 is caused to conduct by virtue of its base becoming more positive, current flows through the resistor 134. The accompanying voltage drop results in the base of the transistor Q3 becoming more negative with the consequence that transistor Q3 becomes more conductive, being of PNP conductivity. Such action, owing to the reduced impedance of the transistor Q3, causes current to flow from the positive side of the battery 26 through the emitter-collector path of the transistor Q3, through the meter 12, the grounds 40, 28 back to the battery 26. If the signal impressed across the terminals 14, 16 should be of reversed polarity, then it follows that the transistors Q2 and Q4 are driven into their conductive states, the flow through the meter 12 then being via the collector-emitter path of the transistor Q4.

Figure 3:
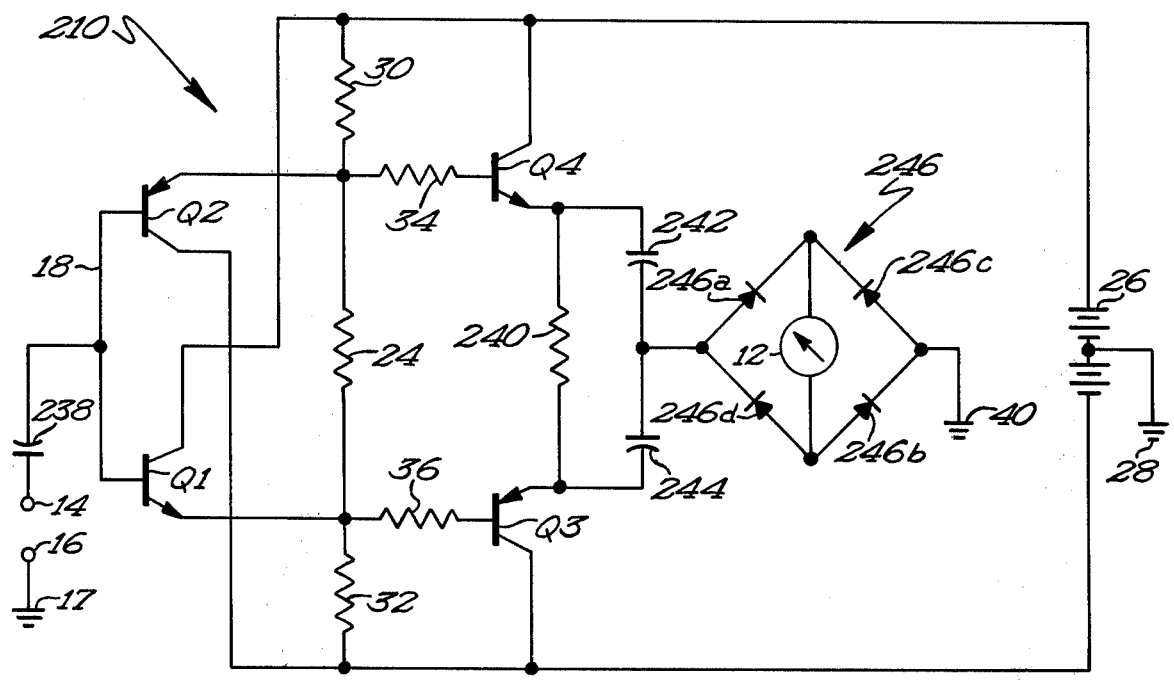
FIG. 3 is a further modification, this particular diagram denoting a circuit for measuring AC signals.

In FIG. 3, the circuit 210 has been modified so as to measure an AC signal across the terminals 14, 16, there being a capacitor 238 between the terminal 14 and the conductor 18 which ties together the bases of the transistors Q1, Q2. In this instance, the emitters of the transistors Q3, Q4 are connected together through an emitter bias resistor 240. The collector of the transistor Q3 is connected to the negative side of the battery 26 and the collector of the transistor Q4 to the positive side.

Also connected between the emitters of the transistors Q3, Q4 are capacitors 242, 244. To the joined sides of the capacitors 242, 244 is connected a full-wave rectifier bridge 246, being composed of diodes 246a, 246b, 246c, and 246d. The meter 12 is connected between the junctions of the diodes 246a, 246c and 246b, 246d. The other side of the bridge 246 is grounded at 40.

The operation of circuit 210 is such that when the AC signal applied to the terminals 14, 16 causes the terminal to go positive, the positive going portion of the AC cycle causes, through the agency of the capacitor 238, the base of transistor Q1 to become more positive and increasingly conductive, since transistor Q1 is a NPN transistor. The decreased impedance through the transistor Q1 literally eliminates, or at least reduces the effect of the resistor 30, thereby applying a greater positive voltage to the base of the transistor Q3 than before transistor Q1 was turned on. The reverse biases the transistor Q3. The shunting or degree of bypassing of the resistors 30, 24 increases the positive bias to the base of the transistor Q4, causing it to become forward biased, the degree of conduction depending on the conductive state of the transistor Q1. The turning on of the transistor Q4 produces a current flow from the positive side of the battery 26, through the collector-emitter of the transistor Q4, the capacitor 242, the diode 246a, the meter 12, the diode 246b, the grounds 40, 28 to the center tap of the battery 26, all in accordance with the magnitude of the AC signal applied to the terminals 14, 16.

When the AC signal goes negative, then the transistor Q1 is turned off or reversed biased and concomitantly the transistor Q4 is reversed biased. However, the making of the base of the transistor Q2 more negative than its emitter turns on this transistor and also the transistor Q3, the latter by reason of the bypassing action of the transistor Q2 with respect to the resistors 24, 32 which increases the negative bias applied to the base of the transistor Q3 because less current flows through the resistor 32 under these conditions. Therefore, current flows from the center tap of the battery 26 through the grounds 28, 40, the diode 246c, the meter 12, the diode 246d, the capacitor 244, the emitter-collector of the transistor Q3 to the negative side of the battery 26, all in accordance with the magnitude of the AC signal during the negative going half of its cycle.

Figure 4:
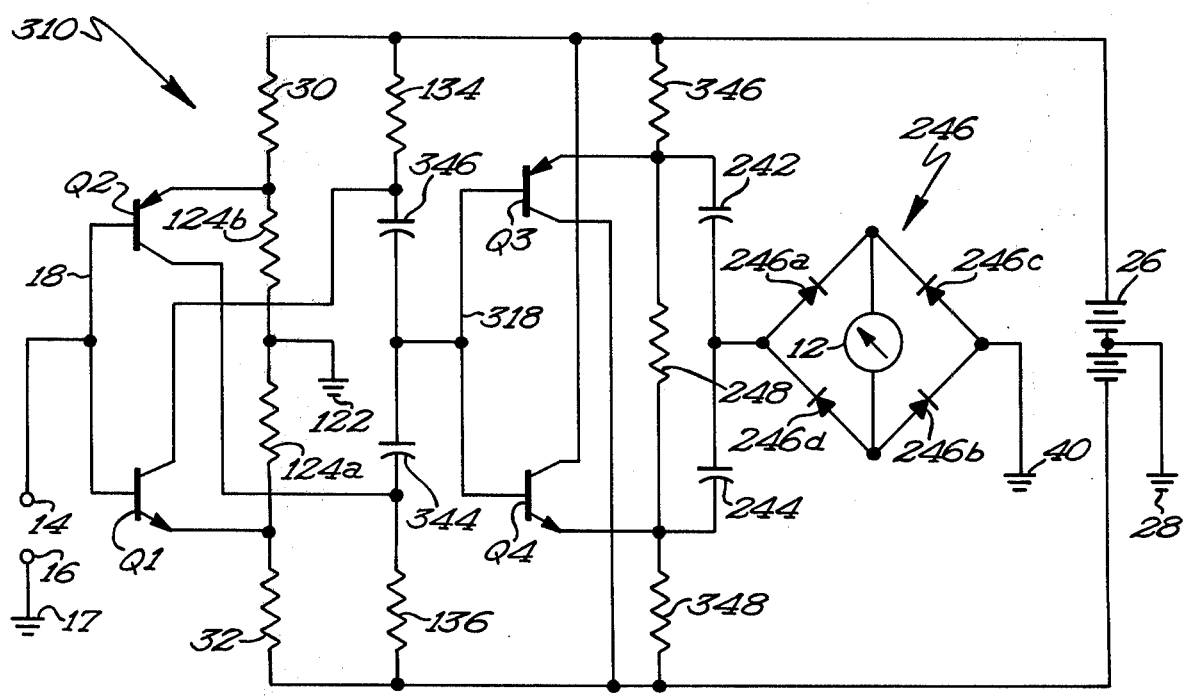
FIG. 4 is still another version of my invention, this arrangement also being used to measure AC signals.

Referring now to FIG. 4, the circuitry there has been generally denoted by reference numeral 310. In this circuit, the collectors of the transistors Q1, Q2 are coupled to the bases of the transistors Q3, Q4 through capacitors 342, 344, respectively, the bases of the transistors Q3, Q4 being tied together via a conductor 318. Also, emitter resistors 346 and 348, together with the resistor 246, are used in supplying the proper biasing to the transistors Q3, Q4.

Consequently, when the transistor Q1 of circuit 310 becomes conductive, as it does when its base is made sufficiently positive, causes the base of the transistor Q3 to become more negative than its emitter, doing so through the capacitor 342. This turns the transistors Q3 on so that current flows from the center tap of the battery 26 through the grounds 28, 40, the diode 246c, meter 12, diode 246d, the capacitor 242, the emitter-collector of the transistor Q3 to the negative side of the battery 26.

When the AC signal goes negative, then the transistor Q2 becomes conductive to turn on the transistor Q4 so that current then flows from the positive side of the battery through the collector-emitter of transistor Q4, the capacitor 244, the diode 246a, meter 12, diode 246b, the grounds 40, 28 to the center tap of the battery 26.

Thus, as with the other circuits 10, 110 and 210 the circuit 310 produces a current flow through the meter 12 that faithfully represents the magnitude of the input signal at the terminals 14, 16.

I claim:

1. A meter and amplifier circuit comprising a pair of input terminals, a first pair of opposite conductivity transistors, a second pair of opposite conductivity transistors, the transistors of each pair having a base, collector and emitter, the bases of said first pair of transistors being connected together and to one of said input terminals, power supply means, a meter, first means connecting said power supply means and meter in circuit with the collector and emitter of one of said second pair of transistors, second means connecting said power supply means and meter in circuit with the collector and emitter of the other of said second pair of transistors, third means connecting the collector and emitter of one of said first pair of transistors in circuit with said power means including a first resistor connected between the emitter of said one of said first pair of transistors and said power supply means, fourth means connecting the collector and emitter of the other of said first pair of transistors in circuit with said power means including a second resistor connected between the emitter of said other of said first pair of transistors and said power means, fifth means connecting the base of said one transistor of said second pair of transistors to said power supply means, sixth means connecting the base of the other of said second pair of transistors to said power supply means, and at least a third resistor connected between the emitter of said first pair of transistors.

2. A meter and amplifier circuit in accordance with claim 1 in which said fifth connecting means also connects the base of said one transistor of said second pair of transistors to the emitter of said one transistor of said first pair of transistors and said sixth connecting means also connects the base of the other of said second pair of transistors to the emitter of said other transistor of said first pair of transistors.

3. A meter and amplifier circuit in accordance with claim 1 in which said fifth connecting means also connects the base of said one transistor of said second pair of transistors to the collector of the other transistors of said first pair of transistors, and in which said sixth connecting means also connects the base of the other of said second pair of transistors to the collector of said one transistor of said first pair of transistors.

4. A meter and amplifier circuit in accordance with claim 2 in which said fifth connecting means includes a resistor between the base of said one transistor of said second pair of transistors and the emitter of said one transistor of said first pair of transistors, and said sixth connecting means includes a resistor between the base of the other of said second pair of transistors and the emitter of the other of said first pair of transistors.

5. A meter and amplifier circuit in accordance with claim 1 including resistance means connected between the emitters of said second pair of transistors.

6. A meter and amplifier circuit in accordance with claim 5 in which said first connecting means includes a capacitor and in which said second means includes a capacitor.

7. A meter and amplifier circuit in accordance with claim 1 in which the collectors of said second pair of transistors are tied together.

* * * * *